(12) United States Patent
Yu et al.

(10) Patent No.: US 9,135,980 B2
(45) Date of Patent: Sep. 15, 2015

(54) MEMORY CONTROL CIRCUIT AND METHOD OF CONTROLLING DATA READING PROCESS OF MEMORY MODULE

(71) Applicant: REALTEK SEMICONDUCTOR CORPORATION, Hsinchu (TW)

(72) Inventors: Chun-Chi Yu, Hsinchu County (TW); Chih-Wei Chang, Hsinchu County (TW); Shen-Kuo Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/326,869

(22) Filed: Jul. 9, 2014

(65) Prior Publication Data
US 2015/0049562 A1 Feb. 19, 2015

(30) Foreign Application Priority Data

Aug. 13, 2013 (TW) .............. 102129068 A

(51) Int. Cl.
  *G11C 7/00* (2006.01)
  *G11C 11/4076* (2006.01)
  *G11C 11/4091* (2006.01)
  *G11C 7/10* (2006.01)

(52) U.S. Cl.
  CPC .......... *G11C 11/4076* (2013.01); *G11C 7/1066* (2013.01); *G11C 11/4091* (2013.01); *G11C 7/1057* (2013.01)

(58) Field of Classification Search
  CPC ........... G11C 11/4076; G11C 11/4091; G11C 7/1066
  USPC ...................... 365/193, 233.1, 233.13, 233.17
  See application file for complete search history.

(56) References Cited

U.S. PATENT DOCUMENTS

| 7,412,616 B2* | 8/2008 | Matsui et al. ................. 713/401 |
| 7,668,679 B2* | 2/2010 | Best .............................. 702/106 |
| 8,086,813 B2 | 12/2011 | Gillingham et al. | |

(Continued)

FOREIGN PATENT DOCUMENTS

TW       201142871       12/2011

OTHER PUBLICATIONS

Office Action and Search Report dated May 19, 2015 for the corresponding Taiwan Patent Application 102129068.

(Continued)

*Primary Examiner* — Toan Le
(74) *Attorney, Agent, or Firm* — WPAT, P.C.; Anthony King

(57) ABSTRACT

This invention discloses a memory control circuit and method of controlling a data reading process of a memory module. In the data reading process, the memory module transmits a data signal and a data strobe signal used to recover the data signal. The data strobe signal includes a preamble part. The method includes steps of: controlling an impedance matching circuit of the memory module so that the data strobe signal is kept at a fixed level before the preamble part; generating a clock; generating an enabling signal according to the clock; sampling the data strobe signal according to the enabling signal to generate a sampled result; adjusting an enabling time of the enabling signal according to the sampled result; and starting a data recovering process for the data signal according to the enabling signal.

20 Claims, 8 Drawing Sheets

(56) References Cited

U.S. PATENT DOCUMENTS

| | | | |
|---|---|---|---|
| 8,270,235 B2* | 9/2012 | Swanson et al. | 365/193 |
| 2007/0058479 A1* | 3/2007 | Matsui | 365/233 |
| 2010/0188910 A1* | 7/2010 | Kizer et al. | 365/193 |
| 2011/0205832 A1 | 8/2011 | Jeon | |

OTHER PUBLICATIONS

English abstract translation of the Office Action dated May 19, 2015 for the corresponding Taiwan Patent Application 102129068. 2011205832A1 is the counterpart of the cited TW publication TW 201142871A1.

* cited by examiner

MEMORY CONTROL CIRCUIT AND METHOD OF CONTROLLING DATA READING PROCESS OF MEMORY MODULE

BACKGROUND OF THE INVENTION

1. Field of the Invention

The present invention relates to a memory control circuit, especially to a circuit and its related method of controlling a data reading process of a memory module.

2. Description of Related Art

Please refer to FIG. 1, which illustrates a system structure of a conventional double data rate synchronous dynamic random access memory (DDR SDRAM). The DDR SDRAM 10 includes a memory control circuit 110 and a memory module 120. The memory control circuit 110 transmits a clock CLK to the memory module 120. The memory module 120 uses the clock CLK as a reference clock during operation. During a reading process, the memory control circuit 110 transmits a read command CMD to the memory module 120, and the memory module 120 accesses its internal data according to the read command CMD to generate a data signal DQ. The memory module 120 then transmits the data signal DQ along with a data strobe signal DQS, which is utilized to recover the data signal DQ, to the memory control circuit 110.

Please refer to FIG. 2, which illustrates a timing diagram of signals of the conventional DDR SDRAM. The data strobe signal DQS includes a preamble part tRPRE followed by a periodic clock part for sampling the data signal DQ. The length of the preamble part tRPRE is about one period of the clock CLK and the central point of the preamble part is marked as P. One purpose of the preamble part tRPRE is to indicate the starting point of the periodic clock part of the data strobe signal DQS. The preamble part tRPRE of the data strobe signal DQS must be found before the data recovery process to ensure that the data recovery process is correct. In addition, the data strobe signal DQS also includes an unstable part TRI (illustrated in stripes), during which signals hop irregularly between high level and low level.

The memory control circuit 110 samples the data signal DQ by the data strobe signal DQS to recover data. However, the clock DDR_CLK inside the memory module 120 has a certain delay with respect to the clock CLK of the memory control circuit 110 due to the wirings on the circuit board and more or less signal delays inside each component. Since the clock DDR_CLK and the clock CLK are not in phase anymore, the data strobe signal DQS generated by the memory module 120 and the clock CLK of the memory control circuit 110 do not belong to the same clock domain; therefore there must be a certain mechanism to correctly find the preamble part tRPRE of the data strobe signal DQS in situations like this.

In a conventional method, a read leveling technology is utilized to find the preamble part tRPRE of the data strobe signal DQS. The memory control circuit 110 refers to the clock CLK to generate a DQS enabling signal DQS_En, which indicates the preamble part tRPRE of the data strobe signal DQS, and therefore it would be better if the DQS enabling signal DQS_En enables (e.g., from low level to high level) at the middle point P of the preamble part tRPRE of the data strobe signal DQS. When the DQS enabling signal DQS_En enables, it means that the preamble part tRPRE of the data strobe signal DQS already occurs, implying that the process of restoring the data signal DQ is about to start. During the read leveling process, the memory control circuit 110 consecutively sends out read command CMD. Each time the read command CMD is sent, the enabling time of the DQS enabling signal DQS_En is delayed by half the period of the clock CLK, and the data strobe signal DQS is sampled by the delayed DQS enabling signal DQS_En. The DQS enabling signal DQS_En corresponding to the first read command CMD sent out by the memory control circuit 110 is determined to be the DQS enabling signal DQS_En required by the system when consecutive sampling results comply with predetermined data types. The enabling time of the DQS enabling signal DQS_En indicates the position of the tRPRE of the data strobe signal DQS. However, this method consumes lots of time and the unstable part TRI of the data strobe signal DQS probably causes this method to misjudge.

In another conventional method, the time of the preamble part tRPRE of the data strobe signal DQS is estimated by a read latency technology. The time after the memory module 120 receives the read command CMD and before it sends out the data strobe signal DQS can be estimated, such as 5 times the period of the clock CLK. Unfortunately, because there exists a delay between clock DDR_CLK and the clock CLK and the delay time is subject to the design, the manufacturing process and even the operating temperature of the circuits and the components, this method probably encounters errors when the memory control circuit 110 assumes that the preamble part tRPRE of the data strobe signal DQS is coming in 5 periods of its own clock CLK after sending out the read command CMD. In addition, the data signal DQ has to be taken into consideration in this method, which increases the operating complexity.

SUMMARY OF THE INVENTION

In consideration of the imperfections of the prior art, an object of the present invention is to provide a memory control circuit and a method of controlling a data reading process of a memory module, so as to make an improvement to the prior art.

The present invention discloses a memory control circuit, for controlling a data reading process of a memory module, during which the memory module transmitting a data signal and a data strobe signal that is used to recover the data signal to the memory control circuit, the data strobe signal comprising a preamble part. The memory control circuit comprises: a clock generating circuit for generating a clock; a control unit coupled to the memory module and the clock generating circuit for controlling an impedance matching circuit of the memory module and generating an enabling signal according to the clock; and a sampling circuit coupled to the control unit for sampling the data strobe signal according to the enabling signal to generate a sampling result; wherein, the control unit first control the impedance matching circuit to make the data strobe signal keep at a fixed level before the preamble part and then controls the sampling circuit to sample the data strobe signal according to the enabling signal, and adjusts an enabling time of the enabling signal according to the sampling result and starts the process of recovering the data signal according to the enabling signal.

The present invention also discloses a method of controlling a data reading process of a memory module. In the data reading process, the memory module transmits a data signal and a data strobe signal that is used to recovery the data signal, and the data strobe signal comprises a preamble part. The method comprises: controlling an impedance matching circuit of the memory module to make the data strobe signal keep at a fixed level before the preamble part; generating a clock; generating an enabling signal according to the clock; sampling the data strobe signal according to the enabling signal to generate a sampling result; adjusting an enabling time of the enabling signal according to the sampling result; and starting a process of recovering the data signal according to the enabling signal.

The memory control circuit and the method of controlling a data reading process of a memory module of this invention are not affected by the unstable part TRI and decrease the judging complexity and therefore a more accurate enabling signal is generated in a more efficient way. A system based on this invention is able to resist the affection of voltage, temperature and manufacturing process and thus reads data from DDR SDRAM in high speed.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. The present invention discloses a memory control circuit and a method of controlling a data reading process of a memory module, and the detail known in this field will be omitted if such detail has little to do with the features of the present invention. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements. Besides, said method invention can be in the form of firmware and/or software which could be carried out by the device of this invention or the equivalent thereof; hence, the following description on the method invention will focus on the processes and steps instead of the hardware without dissatisfying the specification and enablement requirements.

Figure 3:
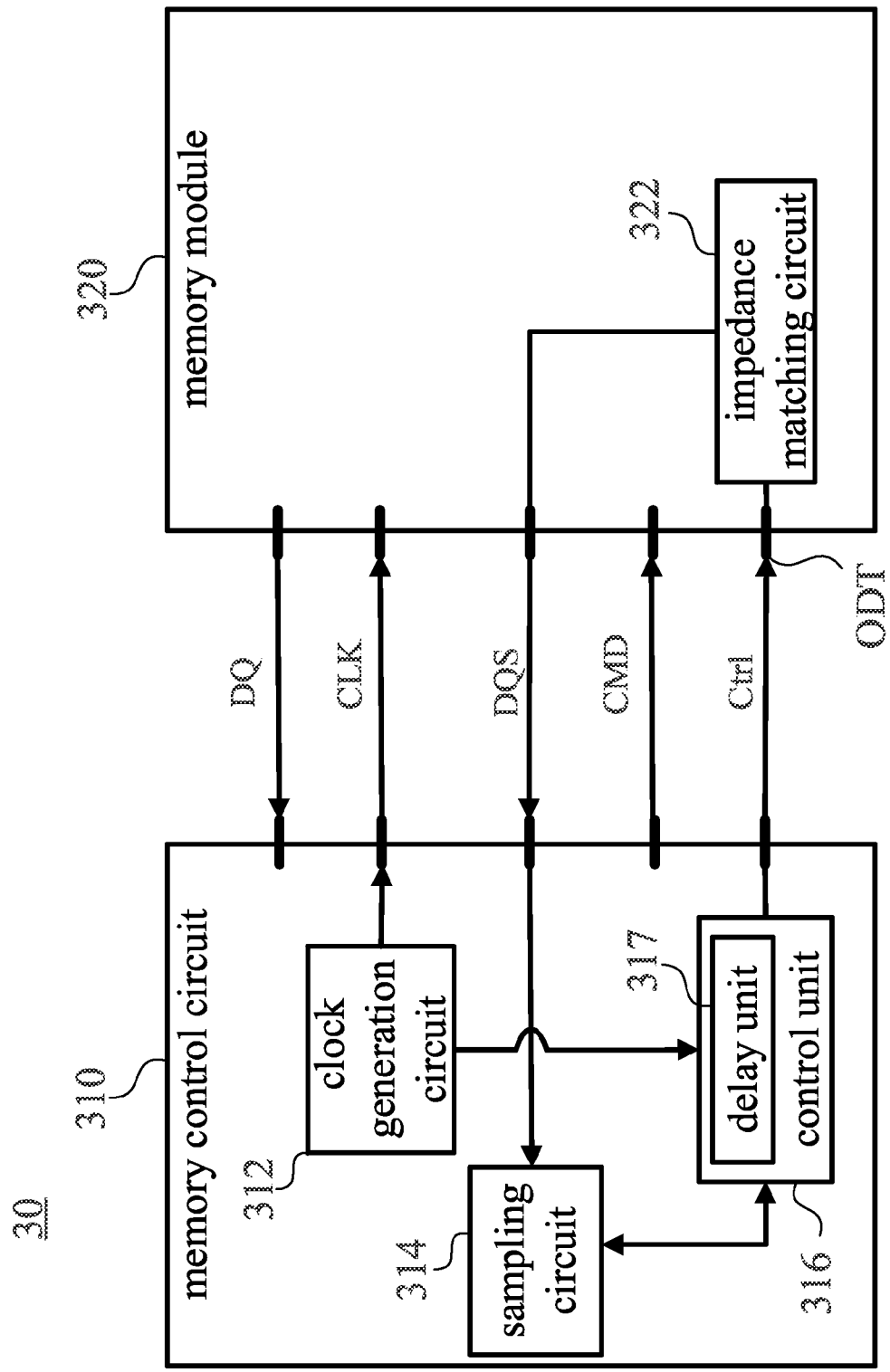
FIG. 3 illustrates a functional block diagram of a memory control circuit according to the present invention.

Please refer to FIG. 3, illustrating a functional block diagram of a memory control circuit according to the present invention. DDR SDRAM 30 comprises a memory control circuit 310 and a memory module 320. The memory control circuit 310 comprises a clock generation circuit 312, a sampling circuit 314, and a control unit 316. The memory module 320 comprises an impedance matching circuit 322. For clear explanation and figure simplicity, FIG. 3 does not depict all the connections between all components or omits the components that are directly related to the present invention. For example, the control unit 316 of the memory control circuit 310 sends out the read command CMD to the memory module 320, but the connection between the control unit 316 and output pin of the read command CMD is omitted; further, in addition to the impedance matching circuit 322 the memory module 320 also comprises other components such as memory dices. The above descriptions are well-known to the person of ordinary skill in the art and are omitted provided that the omission does not dissatisfy the disclosure and enablement requirements. In fact, the impedance matching circuit 322 is the on-die termination (ODT) circuit of the memory module 320, which adjusts the impedance matching of the circuits to eliminate or decrease signal reflections.

Figure 1:
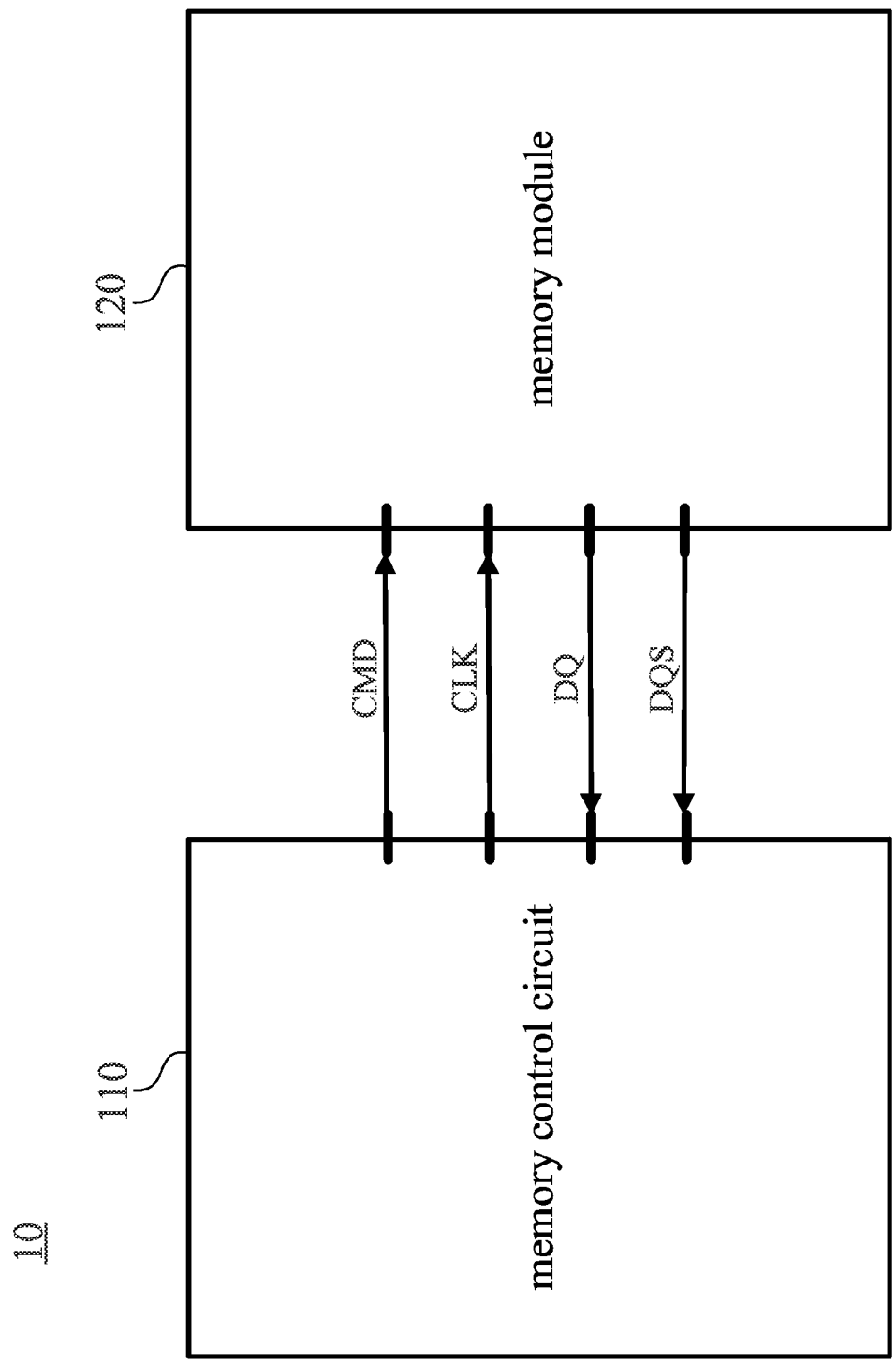
FIG. 1 illustrates a system structure of a conventional double data rate synchronous dynamic random access memory (DDR SDRAM).
Figure 2:
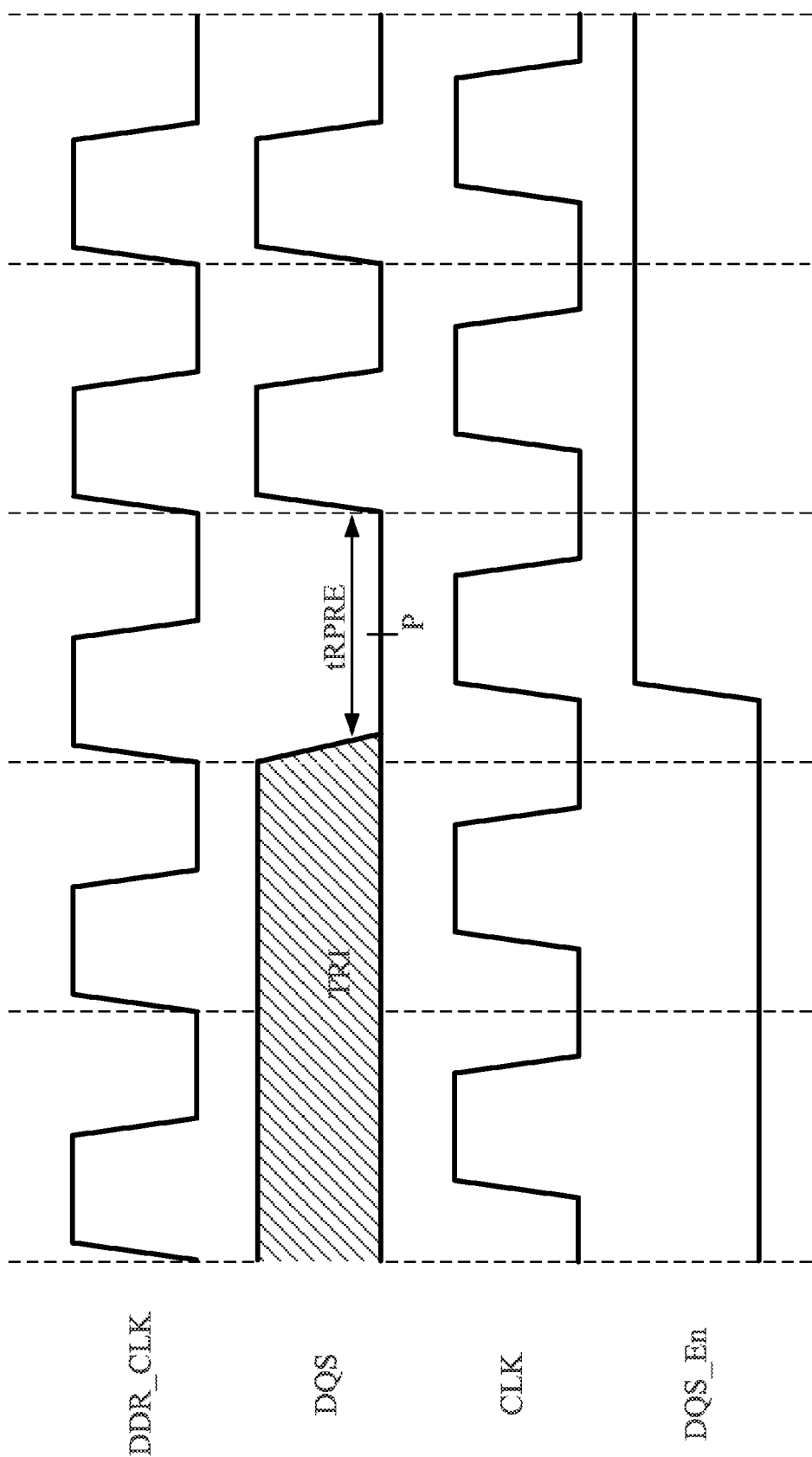
FIG. 2 illustrates a timing diagram of signals of the conventional DDR SDRAM.

Please refer to both FIG. 2 and FIG. 3. In the process of reading data, the control unit 316 generates the DQS enabling signal DQS_En according to the clock CLK generated by the clock generation circuit 312 so that the memory control circuit 310 can find the preamble part tRPRE of the data strobe signal DQS. The sampling circuit 314, which is controlled by the control unit 316, samples the data strobe signal DQS by the DQS enabling signal DQS_En and generates sampling results. The control unit 316 determines whether to adjust the enabling time of the DQS enabling signal DQS_En according to the sampling results. As shown in FIG. 2, when the sampling circuit 314 samples the data strobe signal DQS by the DQS enabling signal DQS_En, the unstable part TRI of the data strobe signal DQS will cause unpredictable sampling results, resulting in misjudges of the control circuit 316. This invention utilizes the control unit 316 to control the impedance matching settings of the impedance matching circuit 322 of the memory module 320 to eliminate the affection of the unstable part TRI in the data strobe signal DQS.

Figure 4:
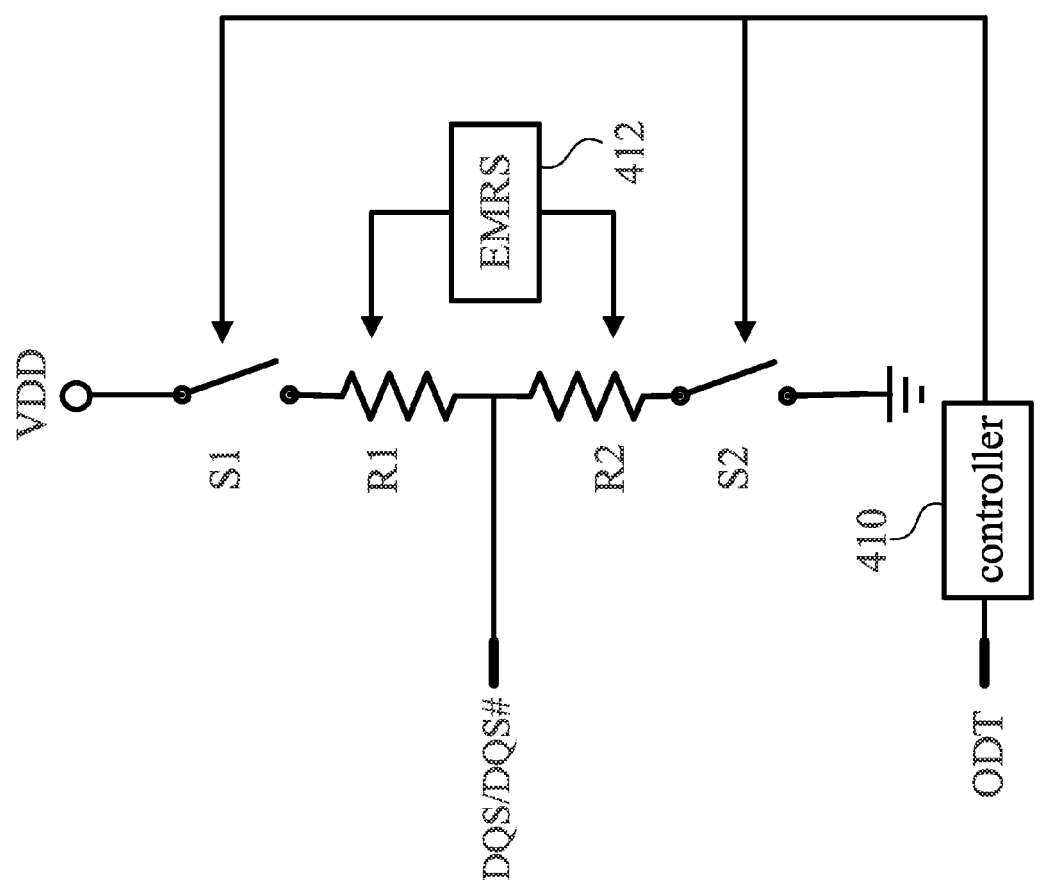
FIG. 4 illustrates an embodiment of the impedance matching circuit 322.

Please refer to FIG. 4, illustrating an embodiment of the impedance matching circuit 322. The switches S1 and S2 are controlled by the controller 410 to switch on and off. The control unit 316 sends out a control signal Ctrl to the memory module 320 via the ODT pin of the memory module 320 to set the controller 410. The values of the resistors R1 and R2 are determined by the extended mode register set (EMRS) 412. The control unit 316 of the memory control circuit 310 can change the values of the resistors R1 and R2 by setting the values of the EMRS 412. For the second generation double data rate synchronous dynamic random access memory (DDR2 SDRAM) and the third generation double data rate synchronous dynamic random access memory (DDR3 SDRAM), the data strobe signal DQS is transmitted by a differential signal pair, which are represented by signal DQS and signal DQS# and are transmitted via two pins of the memory module 320. In a default condition when the impedance matching circuit 322 is on, the switches S1 and S2 are on, the values of the resistors R1 and R2 are set to be equal, and therefore voltage levels of the signal DQS and the signal DQS# are equal to VDD/2. As a result, when the two signals DQS and DQS# are compared by a comparator, the output of the comparator jumps irregularly between high and low levels because the voltages are equal or similar, which is depicted in the unstable part TRI of FIG. 2.

To avoid the misjudge of the preamble part tRPRE caused by the unstable part TRI of the data strobe signal DQS, the control unit 316 changes the impedance matching condition by setting the register value of the EMRS 412 before sending out the read command CMD, during which the memory module 320 has not yet sent out the data strobe signal DQS, and the signals DQS and DQS# are still in their initial states. As a result, a voltage difference is generated between the signals DQS and DQS#, and therefore the comparison result of the comparator is kept at a fixed level. For example, the output of the comparator keeps at low level if the signal DQS is set to have a low voltage level and the signal DQS# is set to have a high voltage level.

Figure 5:
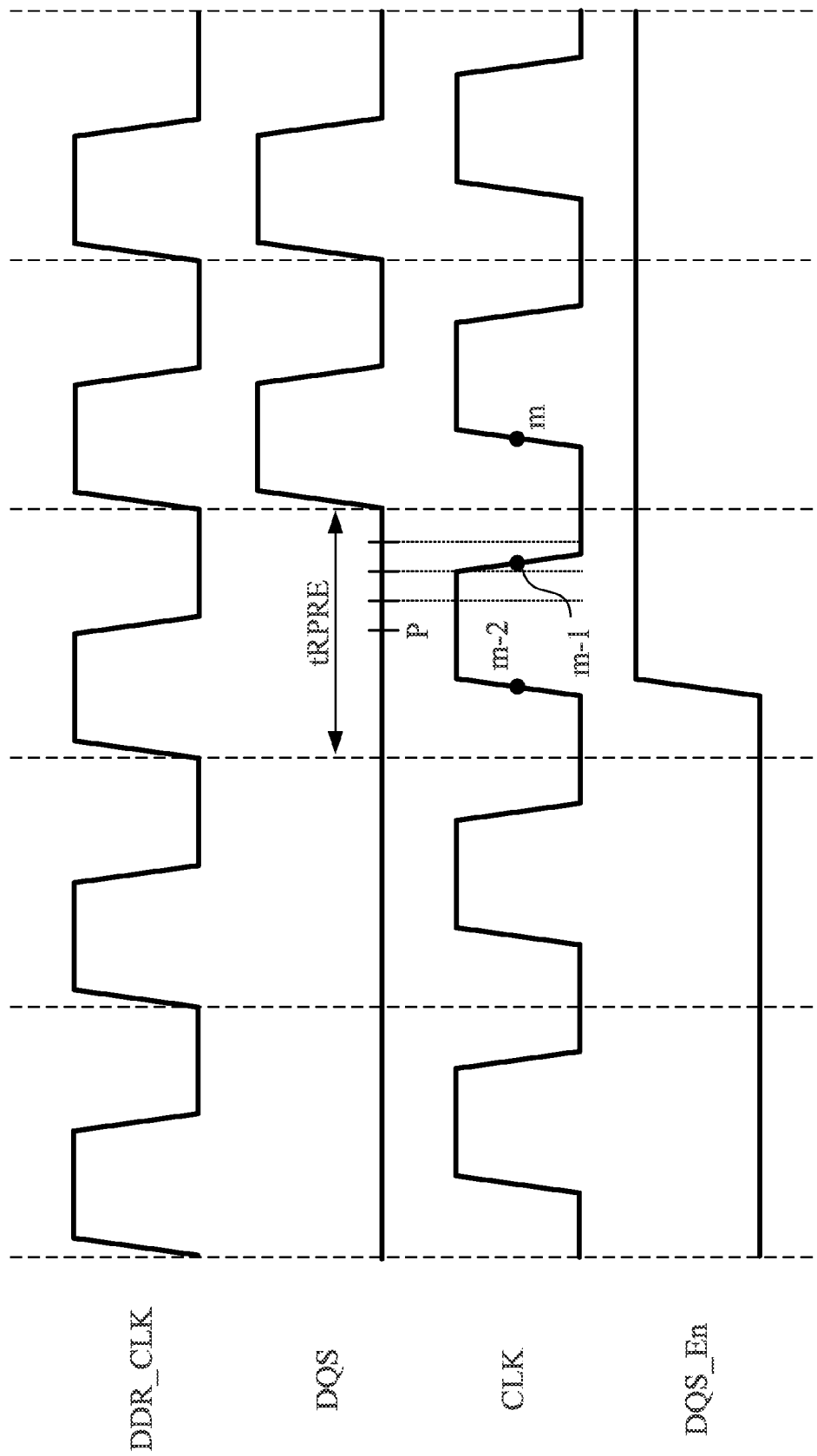
FIG. 5 illustrates a signal timing sequence of DDR SDRAM according to the present invention.

Please refer to FIG. 5, illustrating a signal timing sequence of DDR SDRAM according to the present invention. In comparison with FIG. 2, since the impedance matching condition of the impedance matching circuit 322 has changed, the data strobe signal DQS does not have an unstable part anymore; instead, the signal before the preamble part tRPRE keeps at a fixed voltage level (e.g., low voltage level in FIG. 5). When the control unit 316 triggers the enabling time of the DQS enabling signal DQS_En according to the clock CLK and the enabling time of the DQS enabling signal DQS_En falls at the (m−2)-th clock edge of the clock CLK (where m being an integer greater than 1, and in the example of FIG. 5, m being greater than 7), the sampling result obtained by sampling the data strobe signal DQS according to the DQS enabling signal DQS_En will be 0 (or low voltage level). Afterwards, the control unit 316 generates the read command CMD again and delays the enabling time of the DQS enabling signal DQS_En to the next clock edge (m−1) of the clock CLK, i.e., delaying the DQS enabling signal DQS_En by half the period of the clock CLK; at this time the sampling result obtained by sampling the data strobe signal DQS according to the DQS enabling signal DQS_En will also be 0. The aforementioned steps are repeated, and the sampling result turns 1 (or high voltage level) when the enabling time of the DQS enabling signal DQS_En falls at the clock edge m of the clock CLK. Since the data strobe signal DQS keeps at low level during and before the preamble part tRPRE, the level change of the sampling results stands for the end of the preamble part tRPRE of the data strobe signal DQS. In practical operation, the control unit 316 keeps comparing the sampling result with a predetermined valued of 1. When the sampling result is equal to the predetermined value, which means that the enabling time of the present DQS enabling signal DQS_En is very close to the preamble part tRPRE of the data strobe signal DQS, the enabling time of the DQS enabling signal DQS_En can be determined by tracing back one or two clock edge(s) from the base clock edge that has the sampling result equal to the predetermined value. In this example, the base clock edge is the clock edge m, and the clock edge (m−1) or the clock edge (m−2) is used as the enabling time of the DQS enabling signal DQS_En. Because the data strobe signal DQS and the clock CLK have the same period, the clock edge (m−1) or the clock edge (m−2) can definitely indicate the preamble part tRPRE of the data strobe signal DQS. In short, by the aforementioned steps, first the clock edge m that has a sampling result corresponding to the predetermined value is found and then the clock edge (m−1) or (m−2) which is prior to the clock edge m by 1 or 2 clock edge(s) respectively can be used as the enabling time of the DQS enabling signal DQS_En, which indicates the preamble part tRPRE of the data strobe signal DQS. Therefore, the subsequent data recovery process can be proceeded.

As shown in FIG. 5, however, there is still error between the clock edge (m−1) or the clock edge (m−2) and the middle point P of the preamble part tRPRE of the data strobe signal DQS, and this error may be as much as half the period of the clock CLK. In other words, the accuracy of the DQS enabling signal DQS_En generated by the aforementioned steps is half the period of the clock CLK. To obtain more accurate DQS enabling signal DQS_En, a signal fine tuning process will be proceeded as follows.

Before the fine tuning process starts, the impedance matching circuit 322 that has been adjusted in the above coarse tuning process must be restored to its impedance matching state to eliminate or decrease signal reflections. After the impedance matching circuit 322 restores to its impedance matching state, the data strobe signal DQS before the preamble part tRPRE will have the unstable part TRI instead of keeping at a fixed voltage level, as shown in FIG. 2. Since the approximate enabling time of the DQS enabling signal DQS_En is already found in the coarse tuning process, the final result will not be affected even if the unstable part TRI occurs again in the data strobe signal DQS after the coarse tuning process is done. The fine tuning process of the DQS enabling signal DQS_En can then be proceeded.

The control unit 316 further comprises a delay unit 317. The control unit 316 uses the delay unit 317 to delay the clock CLK and adjust the enabling time of the DQS enabling signal DQS_En according to the delayed clock CLK. The delay time of the delay unit 317 can be set to be n equal portions of two consecutive clock edges of the clock CLK, where n is an integer larger than 1. The delay time is the accuracy of the fine tuning process. Because two consecutive clock edges of the clock CLK correspond to half the period of the clock CLK, the accuracy of the fine tuning process would be T/2n, where T is the period of the clock CLK.

In the following illustrative example, n is set to be 4, which means the accuracy is T/8. The right half part of the preamble part tRPRE of the data strobe signal DQS is divided into 4 equal segments, as shown in FIG. 5, and the clock edge (m−1) falls within the third segment on the right side of the middle point P before the fine tuning process starts. After the first delay, the clock CLK is delayed by T/8, which makes the clock edge (m−1) fall within the fourth segment on the right side of the middle point P, and the control unit 316 takes the time of the clock edge (m−1) to be the enabling time of the DQS enabling signal DQS_En. The control unit 316 also controls the sampling circuit 314 to sample the data strobe signal DQS by the DQS enabling signal DQS_En to generate a delayed sampling result, which is equal to 0 as shown in FIG. 5.

The control unit 316 compares the delayed sampling result with the predetermined value set in the coarse tuning process, and the comparison result shows that these two values are not equal so a next round of fine tuning process must be proceeded. In the second delay process, the clock CLK is further delayed by T/8; in other words, in the second delay process the clock CLK is actually delayed by 2T/8 from the timing sequence as shown in FIG. 5, which is not delayed yet. The delayed clock edge (m−1) falls beyond the preamble part tRPRE of the data strobe signal DQS, and the control unit 316 immediately finds that the delayed sampling result corresponding to the clock edge (m−1) is 1, which is equal to the predetermined value. When the control unit 316 determines that the delayed sampling result is equal to the predetermined value, the present delay time, which is 2T/8, is used to adjust the enabling time of the DQS enabling signal DQS_En. The adjustment process is as follows: the control unit 316 records the present delay time, i.e., 2T/8, and sends out the read command CMD again; during the process of generating the DQS enabling signal DQS_En, the clock CLK is delayed by 2T/8, and this time the enabling time of the DQS enabling signal DQS_En is adjusted according to the time of the clock edge (m−2). As shown in FIG. 5, the adjusted DQS enabling signal DQS_En has an enabling time closer to the middle point P of the preamble part tRPRE of the data strobe signal DQS, and the error is smaller than the accuracy of the fine tuning process.

Figure 6:
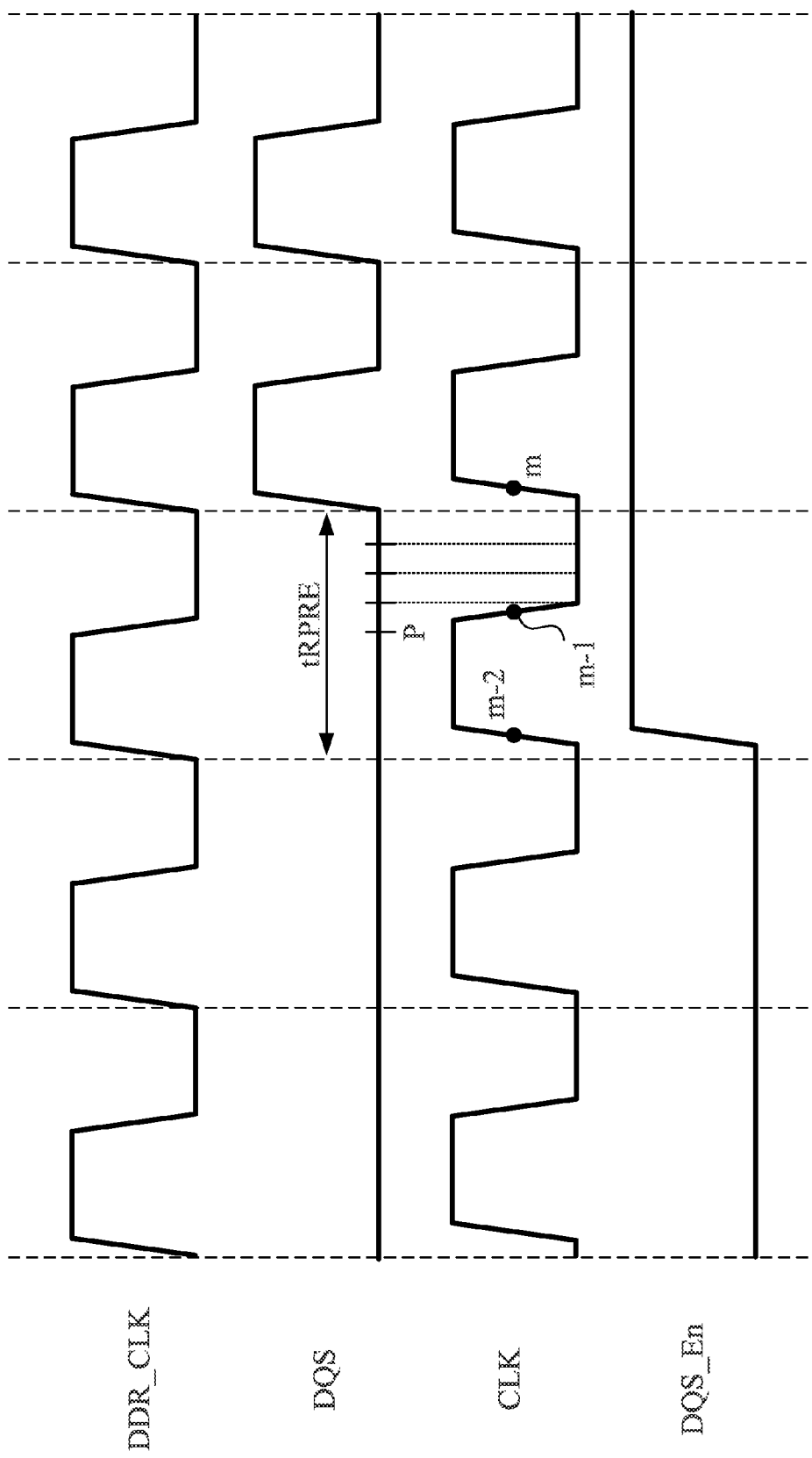
FIG. 6 illustrates another signal timing sequence of DDR SDRAM according to the present invention.

Please refer to FIG. 6, illustrating another signal timing sequence of DDR SDRAM according to the present invention. In this illustrative example, n is also set to be 4. The clock edge (m−1) falls within the first segment on the right side of the middle point P of the preamble part tRPRE of the DQS. After 3 times of delays, the delayed sampling result corresponding to the clock edge (m−1) is still not equal to the predetermined value. At the fourth delay, which has a delay time of 4T/8 with respect to a not delayed status, the control unit 316 finds that the delayed sampling result corresponding to the clock edge (m−1) is equal to the predetermined value. Then the control unit 316 adjusts the enabling time of the DQS enabling signal DQS_En according to the time of the clock edge (m−2) with a delay of 4T/8. In fact, however, the time of the clock edge (m−2) with a delay of 4T/8 is the time of the original clock edge (m−1). In short, the above steps can be summarized as follows: assuming that the delay time is set to be n equal portions of two consecutive clock edges of the clock CLK, when the control unit 316 delays the clock CLK at the (n−1)-th time, i.e., the delay time is (n−1)T/2n, and the delayed sampling result corresponding to the clock edge (m−1) is still not equal to the predetermined value, the control unit 316 can hence use the time of the original clock edge (m−1) to adjust the enabling time of the DQS enabling signal DQS_En.

Figure 7:
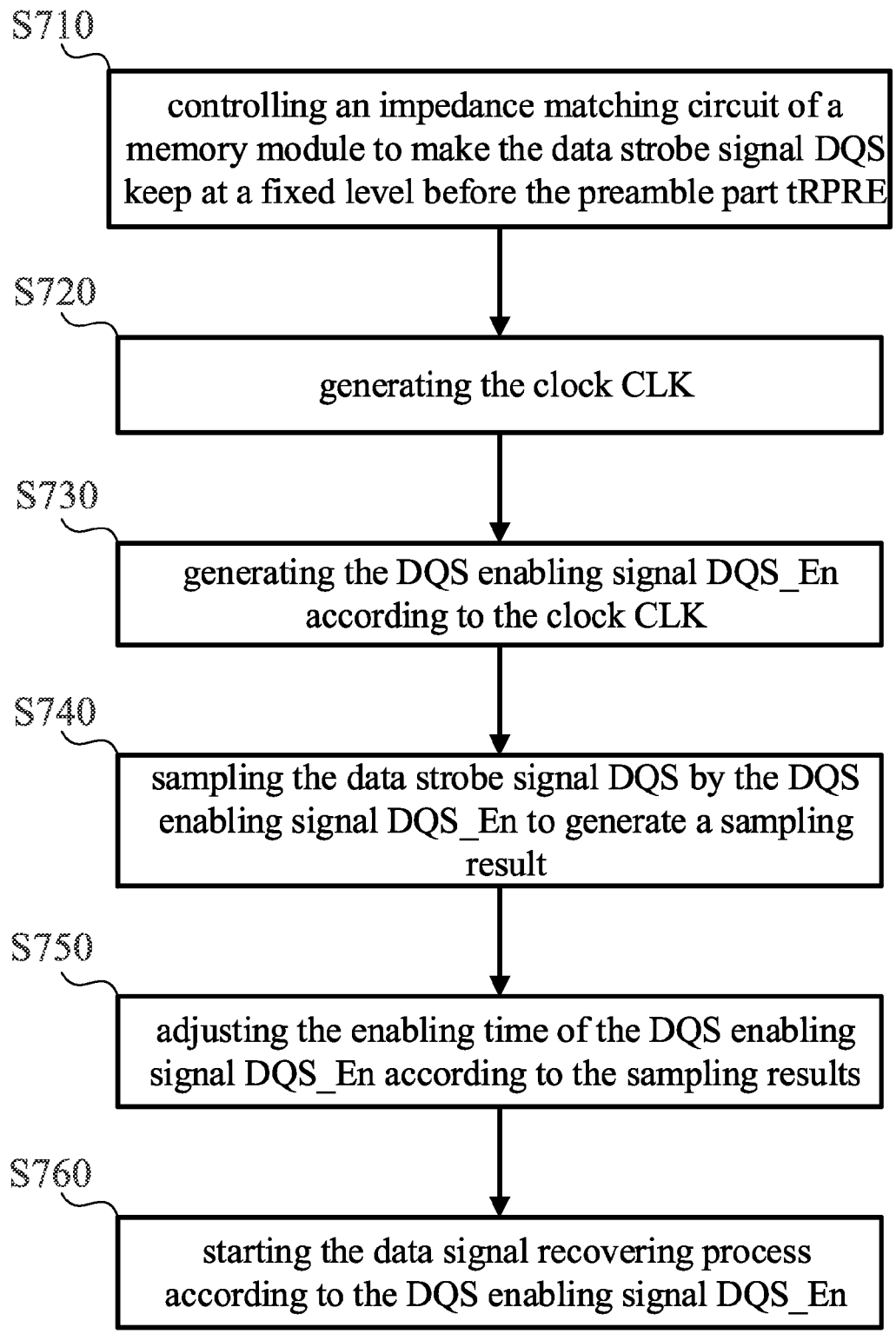
FIG. 7 illustrates a flow chart of the coarse tuning process of a method for controlling a data reading process of a memory module according to the present invention.

Please refer to FIG. 7, illustrating a flow chart of the coarse tuning process of a method for controlling a data reading process of a memory module according to the present invention. In addition to the aforementioned memory control circuit 310, this invention also discloses a corresponding method of controlling the data reading process of the memory module, which is applied to a DDR SDRAM for adjusting the enabling time of the DQS enabling signal DQS_En, so that the preamble part of the data strobe signal DQS of a DDR SDRAM is more accurately identified. This method is carried out by the aforementioned memory control circuit 310 and its equivalent circuits. As shown in FIG. 7, one embodiment of the present invention comprises the following steps:

Step S710: controlling an impedance matching circuit of a memory module to make the data strobe signal DQS keep at a fixed level before the preamble part tRPRE. As shown in FIG. 2, the data strobe signal DQS has the unstable part TRI before the preamble part tRPRE. To prevent the unstable part TRI from causing a misjudge of the preamble part tRPRE, the impedance matching circuit 322 inside the memory module 320 is firstly controlled to make the differential signal pair DQS and DQS# of the data strobe signal DQS generate a voltage difference so that a comparison result of a comparator keeps at a fixed level. The timing sequence after adjustment is shown as FIG. 5;

Step S720: generating the clock CLK. The clock CLK becomes the clock DDR_CLK after sending to the memory module 320, and there is a delay between these two signals caused by wirings on the circuit board or the components;

Step S730: generating the DQS enabling signal DQS_En according to the clock CLK. The enabling time of the DQS_En is determined according to the clock edges (rising edge or falling edge) of the clock CLK. As shown in FIG. 5, the clock edge (m−2) is used as the enabling time to generate the DQS enabling signal DQS_En;

Step S740: sampling the data strobe signal DQS by the DQS enabling signal DQS_En to generate a sampling result. As shown in FIG. 5, the DQS enabling signal DQS_En will samples the preamble part tRPRE of the data strobe signal DQS and a sampling result of 0 will be obtained;

Step S750: adjusting the enabling time of the DQS enabling signal DQS_En according to the sampling results. Because the sampling result is not equal to the predetermined value 1, which means that the sampling time has not reached the preamble part tRPRE of the data strobe signal DQS or is just at the preamble part tRPRE, the beginning of the preamble part tRPRE can not be determined yet. The read command has to be resent to make steps S730 and S740 be executed again. During the new adjustment process, the clock edge next to the clock edge (m−2) (i.e., the clock edge (m−1)) is used as the enabling time of the DQS enabling signal DQS_En, and the newly generated DQS enabling signal DQS_En is used to sample the data strobe signal DQS to generate a sampling result. The above steps are repeated until the sample result is equal to 1, which means that the enabling time of the DQS enabling signal DQS_En is beyond the preamble part tRPRE of the data strobe signal DQS, as shown by the clock edge m in FIG. 5. Because the preamble part tRPRE of the data strobe signal DQS is about one period of the clock CLK, the clock edges (m−1) and (m−2) can be ensured to indicate the preamble part tRPRE of the data strobe signal DQS. That is, the DQS enabling signal DQS_En which uses the time of the clock edge (m−1) or the clock edge (m−2) as its enabling time can accurately identify the preamble part tRPRE of the data strobe signal DQS;

Step S760: starting the data signal recovering process according to the DQS enabling signal DQS_En. After the enabling time of the DQS enabling signal DQS_En is adjusted to be at an ideal timing, the data signal recovering process can then be started based on the DQS enabling signal DQS_En to recover data carried by the data signal.

Figure 8:
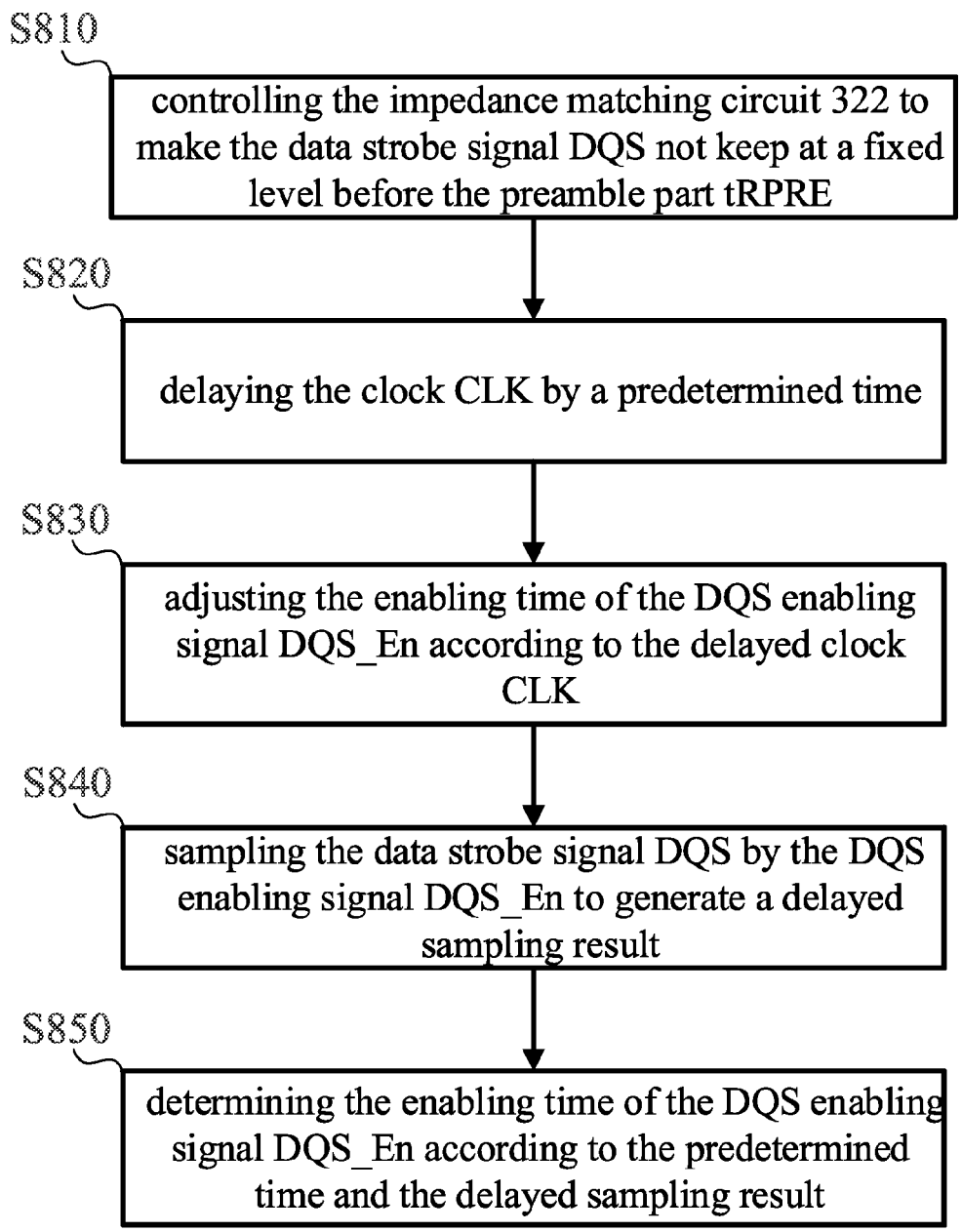
FIG. 8 illustrates a flow chart of the fine tuning process of a method for controlling a data reading process of a memory module according to the present invention.

Please refer to FIG. 8, illustrating a flow chart of the fine tuning process of a method for controlling a data reading process of a memory module according to the present invention. The process in FIG. 7 is considered to be the coarse tuning process. The process in FIG. 8 further fine tunes the DQS enabling signal DQS_En so that the enabling time of which is closer to the middle point of the preamble part tRPRE of the data strobe signal DQS. As shown in FIG. 8, the method of fine tuning the DQS enabling signal DQS_En according to this invention comprises the following steps:

Step S810: controlling the impedance matching circuit 322 to make the data strobe signal DQS not keep at a fixed level before the preamble part tRPRE. After the coarse tuning process of FIG. 7 is complete, i.e., the clock edge (m−1) or the clock edge (m−2) is found, it is no longer required to keep the unstable part of the data strobe signal DQS at a fixed level; instead, the impedance matching circuit 322 needs to be adjusted to its impedance matching condition to avoid signal reflections;

Step S820: delaying the clock CLK by a predetermined time. n equal portions of two consecutive clock edges of the clock CLK can be taken as basic time with n being an integer larger than 1, and an integer multiple of the basic time is delayed each time. Assuming that the period of the clock CLK is T and n is equal to 4, the basic time is T/8, and the predetermined time is kT/8, where k is the delay times in the fine tuning process. As a result, the predetermined time of the first delay is T/8, the predetermined time of the second delay is 2T/8, and so forth. The predetermined time here is measured with respect to the original clock CLK, which is not yet delayed, and the difference between the predetermined time of two consecutive delays is T/8. For clear and convenient explanation, n being equal to 4 is taken as an example, and the right half side of the preamble part tRPRE of the data strobe signal DQS is divided into 4 equal segments, each being equal to T/8;

Step S830: adjusting the enabling time of the DQS enabling signal DQS_En according to the delayed clock CLK. As shown in FIG. 5, the clock edge (m−1), which is found in the coarse tuning process, will move to the fourth segment on the right side of the middle point P after a first delay by a predetermined time of T/8 in the step S820 of this fine tuning process. This step takes this time as the enabling time of the DQS enabling signal DQS_En;

Step S840: sampling the data strobe signal DQS by the DQS enabling signal DQS_En to generate a delayed sampling result. A delayed sampling result 0 (i.e., the value at the fourth segment on the right side of the middle point P) will be obtained by sampling the data strobe signal DQS by the DQS enabling signal DQS_En generated in the step S830; and Step S850: determining the enabling time of the DQS enabling signal DQS_En according to the predetermined time and the delayed sampling result. When the delayed sampling result is not equal to the predetermined value 1, the steps S820~S840 will repeat until the delayed sampling result is equal to 1. As shown in FIG. 5, when the clock CLK is delayed at the second time with the predetermined time equal to T/4, the delayed sampling result is equal to 1; at this time, the enabling time of the DQS enabling signal DQS_En is determined to be the time of the clock edge (m−2), i.e., 1 clock edge prior to the clock edge (m−1), plus the predetermined time. On the other hand, as shown in FIG. 6, the delayed sampling result is not equal to 1 until the fourth delay (with the predetermined time of T/2); at this time, the enabling time of the DQS enabling signal DQS_En is determined to be the time of the clock edge (m−2) delayed by the predetermined time. However, since the difference between the clock edge (m−1) and the clock edge (m−2) is equal to T/2, it can be concluded that when the delay for the (n−1)-th time is performed and the delayed sampling result is not equal to 1, the time of the clock edge (m−1) of the original clock CLK can be used as the enabling time of the DQS enabling signal DQS_En.

In summary, after the fine tuning process as shown in FIG. 8, the enabling time of the DQS enabling signal DQS_En is closer to the middle point P of the preamble part tRPRE of the data strobe signal DQS. Therefore, the system becomes more resistant to influences such as voltage, temperature and manufacturing process, and can therefore reads data from the DDR SDRAM in high speed.

Since people of ordinary skill in the art can appreciate the implementation detail and the modification thereto of the present method invention of FIG. 7 and FIG. 8 through the disclosure of the device invention of FIG. 3, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention. Besides, each aforementioned embodiment may include one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A memory control circuit, for controlling a data reading process of a memory module, during which the memory module transmitting a data signal and a data strobe signal that is used to recover the data signal to the memory control circuit, the data strobe signal comprising a preamble part, and the memory control circuit comprising:
   a clock generating circuit for generating a clock;
   a control unit coupled to the memory module and the clock generating circuit for controlling an impedance matching circuit of the memory module and generating an enabling signal according to the clock; and
   a sampling circuit coupled to the control unit for sampling the data strobe signal according to the enabling signal to generate a sampling result;
   wherein, the control unit first control the impedance matching circuit to make the data strobe signal keep at a fixed level before the preamble part and then controls the sampling circuit to sample the data strobe signal according to the enabling signal, and adjusts an enabling time of the enabling signal according to the sampling result and starts the process of recovering the data signal according to the enabling signal.

2. The memory control circuit of claim 1, wherein the data strobe signal is transmitted by a differential signal pair, and the control unit controls the impedance matching circuit to generate a voltage difference between two pins of the memory module that are used to transmit the differential signal pair so that the data strobe signal keeps at the fixed level before the preamble part.

3. The memory control circuit of claim 1, wherein the control unit comprises:
   a delay unit for delaying the clock;
   wherein the control unit uses the delay unit to delay the clock by a predetermined time and adjusts the enabling time of the enabling signal according to the delayed clock to further control the sampling circuit to sample the data strobe signal according to the enabling signal to generate a delayed sampling result, and the control unit determines the enabling time of the enabling signal according to the predetermined time and the delayed sampling result.

4. The memory control circuit of claim 3, wherein before delaying the clock, the control unit controls the impedance matching circuit to make the data strobe signal not keep at the fixed level before the preamble part.

5. The memory control circuit of claim 3, wherein a time difference between two consecutive clock edges of the clock is T, and the predetermined time is kT/n, where n is an integer larger than 1, and k is an integer larger than or equal to 1 and smaller than n.

6. The memory control circuit of claim 3, wherein the control unit adjusts the enabling time of the enabling signal in order according to the plurality of clock edges of the clock, and the sampling circuit obtains a plurality of sampling results, and the control unit finds a target clock edge corresponding to a sampling result among the plurality of sampling results that matches a predetermined value and adjusts the enabling time of the enabling signal according to the target clock edge.

7. The memory control circuit of claim 6, wherein if the target clock edge is the m-th clock edge of the clock, the control unit adjusts the enabling time of the enabling signal to be close to the (m−1)-th clock edge, where m is an integer larger than 1.

8. The memory control circuit of claim 7, wherein the delayed sampling result corresponds to the (m−1)-th clock edge.

9. The memory control circuit of claim 8, wherein when the delayed sampling result is equal to the predetermined value, the control unit utilizes the time of the (m−2)-th clock edge delayed by the predetermined time to be the enabling time of the enabling signal.

10. The memory control circuit of claim 1, wherein the memory module is the memory module of a DDR SDRAM.

11. A method of controlling a data reading process of a memory module, in the data reading process, the memory module transmitting a data signal and a data strobe signal that is used to recovery the data signal, and the data strobe signal comprising a preamble part, and the method comprising:
controlling an impedance matching circuit of the memory module to make the data strobe signal keep at a fixed level before the preamble part;
generating a clock;
generating an enabling signal according to the clock;
sampling the data strobe signal according to the enabling signal to generate a sampling result;
adjusting an enabling time of the enabling signal according to the sampling result; and
starting a process of recovering the data signal according to the enabling signal.

12. The method of claim 11, wherein the data strobe signal is transmitted by a differential signal pair, and the step of controlling the impedance matching circuit controls the impedance matching circuit to generate a voltage difference between two pins of the memory module that are used to transmit the differential signal pair so that the data strobe signal keeps at the fixed level before the preamble part.

13. The method of claim 11, further comprising:
delaying the clock by a predetermined time;
adjusting the enabling time of the enabling signal according to the delayed clock;
sampling the data strobe signal according to the enabling signal to generate a delayed sampling result; and
determining the enabling time of the enabling signal according to the predetermined time and the delayed sampling result.

14. The method of claim 13, further comprising:
controlling the impedance matching circuit to make the data strobe signal not keep at the fixed level before the preamble part.

15. The method of claim 13, wherein a time difference between two consecutive clock edges of the clock is T, and the predetermined time is kT/n, where n is an integer larger than 1, and k is an integer larger than or equal to 1 and smaller than n.

16. The method of claim 13, wherein the step of generating the enabling signal according to the clock comprises:
adjusting the enabling time of the enabling signal in order according to the plurality of clock edges of the clock;
and the step of sampling the data strobe signal according to the enabling signal obtains a plurality of sampling results, and the step of adjusting the enabling time of the enabling signal according to the sampling results comprises:
finding a target clock edge corresponding to a sampling result among the plurality of sampling results that matches a predetermined value and adjusting the enabling time of the enabling signal according to the target clock edge.

17. The method of claim 16, wherein if the target clock edge is the m-th clock edge of the clock, the step of controlling the enabling time of the enabling signal according to the target clock edge adjusts the enabling time of the enabling signal to be close to the (m−1)-th clock edge, where m is an integer larger than 1.

18. The method of claim 17, wherein the delayed sampling result corresponds to the (m−1)-th clock edge.

19. The method of claim 18, wherein the step of determining the enabling time of the enabling signal according to the predetermined time and the delayed sampling result comprises:
when the delayed sampling result is equal to the predetermined value, utilizing the time of the (m−2)-th clock edge delayed by the predetermined time to be the enabling time of the enabling signal.

20. The method of claim 11, wherein the memory module is the memory module of a DDR SDRAM.

* * * * *